(12) United States Patent
Suzuki

(10) Patent No.: US 12,704,569 B2
(45) Date of Patent: Aug. 11, 2026

(54) MRI APPARATUS AND RF AMPLIFIER

(71) Applicant: Canon Kabushiki Kaisha, Tokyo (JP)

(72) Inventor: Hisanori Suzuki, Otawara (JP)

(73) Assignee: Canon Kabushiki Kaisha, Tokyo (JP)

( * ) Notice: Subject to any disclaimer, the term of this patent is extended or adjusted under 35 U.S.C. 154(b) by 158 days.

(21) Appl. No.: 18/661,884

(22) Filed: May 13, 2024

(65) Prior Publication Data

US 2024/0393415 A1 Nov. 28, 2024

(30) Foreign Application Priority Data

May 22, 2023 (JP) ................................ 2023-084154

(51) Int. Cl.
*G01R 33/36* (2006.01)
*G01R 33/54* (2006.01)

(52) U.S. Cl.
CPC ..... *G01R 33/3614* (2013.01); *G01R 33/3607* (2013.01); *G01R 33/543* (2013.01)

(58) Field of Classification Search
CPC ............ G01R 33/3614; G01R 33/3607; G01R 33/543; G01R 33/5659
See application file for complete search history.

(56) References Cited

U.S. PATENT DOCUMENTS

2021/0025953 A1* 1/2021 Liu ...................... G01R 33/583

FOREIGN PATENT DOCUMENTS

JP 2022-175845 A 11/2022

* cited by examiner

*Primary Examiner* — G.M. A Hyder
(74) *Attorney, Agent, or Firm* — Oblon, McClelland, Maier & Neustadt, L.L.P.

(57) ABSTRACT

In one embodiment, an MRI apparatus comprising: an RF coil configured to transmit an RF signal to an object; an RF amplifier configured to output the RF signal to a load including at least the RF coil and the object, wherein the RF amplifier comprises: an RF amplification circuit configured to amplify an inputted RF signal; and control circuitry configured to acquire load impedance information of the load in a first scan, determine compensation data for compensating nonlinearity of the RF signal to be outputted from the RF amplification circuit for each amplitude of the inputted RF signal based on the load impedance information, and compensate for the RF signal to be outputted from the RF amplification circuit in a second scan for each amplitude of the inputted RF signal by using the compensation data.

15 Claims, 13 Drawing Sheets

MRI APPARATUS AND RF AMPLIFIER

CROSS-REFERENCE TO RELATED APPLICATION

This application claims the benefit of priority of Japanese Patent Application No. 2023-084154, filed on May 22, 2023, the entire contents of which are incorporated herein by reference.

FIELD

Disclosed embodiments relate to an MRI (magnetic resonance imaging) apparatus and an RF (radio frequency) amplifier.

BACKGROUND

An MRI apparatus is an imaging apparatus that magnetically excites nuclear spin of an object placed in a static magnetic field by applying an RF (radio frequency) signal having the Larmor frequency and reconstructs an image on the basis of MR (magnetic resonance) signals emitted from the object due to the excitation.

Conventionally, the MRI apparatus uses an RF amplifier configured to amplify RF signals. Impedance mismatch caused by variation in its load impedance from a predetermined reference value can be a factor of degradation of linearity of the RF amplifier.

Thus, techniques to suppress the degradation of linearity of the RF amplifier are used. For example, in a known RF amplifier, an isolator is provided between an RF amplification circuit and an output terminal so as to remove reflected-wave power from the output terminal side to the RF amplification circuit, and this configuration suppresses variation in the load impedance due to the reflected-wave power and thereby suppresses the degradation of linearity.

DETAILED DESCRIPTION

Hereinbelow, respective embodiments of MRI apparatuses and RF amplifiers will be described in detail by referring to the accompanying drawings.

In one embodiment, an MRI apparatus comprising: an RF coil configured to transmit an RF signal to an object; an RF amplifier configured to output the RF signal to a load including at least the RF coil and the object, wherein the RF amplifier comprises: an RF amplification circuit configured to amplify an inputted RF signal; and control circuitry configured to acquire load impedance information of the load in a first scan, determine compensation data for compensating nonlinearity of the RF signal to be outputted from the RF amplification circuit for each amplitude of the inputted RF signal based on the load impedance information, and compensate for the RF signal to be outputted from the RF amplification circuit in a second scan for each amplitude of the inputted RF signal by using the compensation data.

(Overall Configuration of MRI Apparatus)

Figure 1:
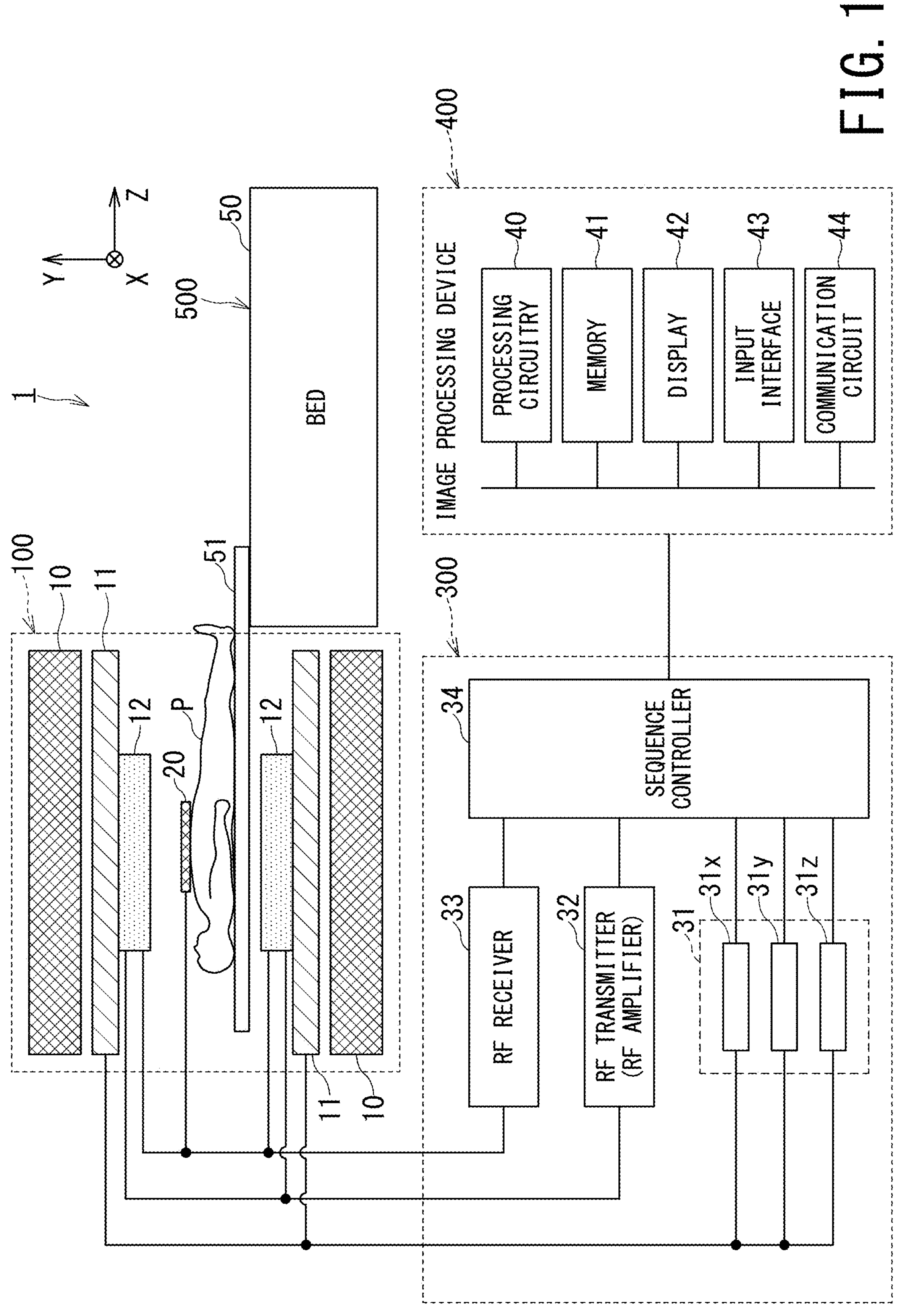
FIG. 1 is a block diagram illustrating an overall configuration of an MRI apparatus according to one embodiment.

The MRI apparatus 1 according to the embodiment can utilize magnetic resonance imaging techniques. FIG. 1 is a block diagram illustrating an overall configuration of the MRI apparatus 1 according to the embodiment. The MRI apparatus 1 includes a gantry 100, a control cabinet 300, an image processing device 400 such as a console, and a bed 500.

The gantry 100 and the bed 500 are disposed in a shielded room called an examination room, for example. The control cabinet 300 is disposed in a machine room, for example. The image processing device 400 is disposed in a control room, for example. Note that the image processing device 400 may be installed in a remote location away from the control room and be connected to the MRI apparatus 1 via a network.

The gantry 100 includes a static magnetic field magnet 10, a gradient coil assembly 11, and a WB (Whole Body) coil 12. The static magnetic field magnet 10 of the gantry 100 is broadly classified into a cylindrical type in which the magnet has a cylindrical structure and an open type in which a pair of magnets are arranged above and below an imaging space interposed therebetween. Although a description will be given of a case where the gantry 100 of the MRI apparatus 1 is cylindrical, the MRI apparatus 1 may be configured as the open-type MRI apparatus. The open-type MRI apparatus has the same configuration as the cylindrical-type MRI apparatus 1 except that each of the static magnetic field magnets, the gradient coil assembly, and the WB coil constituting the gantry are formed into a pair of tabular shapes in parallel with each other.

The static magnetic field magnet 10 is substantially in the form of a cylinder and generates a static magnetic field inside a bore into which an object P is moved. The bore is a space inside the cylindrical structure of the gantry 100. The static magnetic field magnet 10 includes a housing for holding liquid helium, a refrigerator for cooling down the liquid helium to an extremely low temperature, and a superconducting coil inside the housing, for example. The static magnetic field magnet 10 may be configured as a permanent magnet. In the following, a description will be given of a case where the static magnetic field magnet 10 has the superconducting coil.

The static magnetic field magnet 10 includes the superconducting coil inside, and the superconducting coil is cooled down to an extremely low temperature by the liquid helium. The static magnetic field magnet 10 generates the static magnetic field by applying an electric current provided from a static magnetic field power supply to the superconducting coil in an excitation mode. Afterward, the static magnetic field magnet 10 shifts to a persistent current mode, and the static magnetic field power supply is disconnected. Once it shifts to the persistent current mode, the static magnetic field magnet 10 continues to generate a strong static magnetic field for a long time, for example, over one year.

The gradient coil assembly 11 is substantially in the form of a cylinder similarly to the static magnetic field magnet 10, and is fixed to the inside of the static magnetic field magnet 10. This gradient coil assembly 11 is composed of three gradient coils for the respective X-axis, Y-axis, and Z-axis. The three gradient coils generate gradient magnetic fields in the respective directions of the X-axis, the Y-axis, and the Z-axis by being supplied with gradient magnetic field currents (i.e., electric power) from respective gradient coil power supplies 31 (31*x* for the X-axis, 31*y* for the Y-axis, and 31*z* for the Z-axis) so as to apply the generated gradient magnetic fields to the object P. The above-described Z-axis direction is the direction along the static magnetic field, the Y-axis direction is the direction along the gravity direction, and the X-axis direction is the direction perpendicular to both the Z-axis and the Y-axis.

The WB coil 12 is shaped substantially in the form of a cylinder so as to surround the object P and is installed inside the gradient coil assembly 11. The WB coil 12 functions as a transmitting coil. In other words, the WB coil 12 applies an RF pulse based on the RF signal transmitted from an RF transmitter 32 to the object P. In some cases, the WB coil 12 has a function as a receiving coil in addition to the function as a transmitting coil that transmits RF pulses. In this case, the WB coil 12 also serves as a receiving coil so as to receive MR signals emitted from the object P by the excitation of the atomic nuclei. The WB coil 12 is one aspect of an RF coil.

The MRI apparatus 1 may include a local coil 20 in addition to the WB coil 12. The local coil 20 is disposed close to the body surface of the object P. The local coil 20 may include a plurality of coil elements. There are various models of the local coil 20 such as a head coil, a chest coil, an abdomen coil, a spine coil, and a knee coil. Although FIG. 1 illustrates a case where the local coil 20 is the chest coil, embodiments are not limited to such an aspect.

The local coil 20 functions as a receiving coil. In other words, the local coil 20 receives the MR signals. The local coil 20 may be a transmitting/receiving coil that has both the function to transmit the RF pulses as a transmitting coil and the function to receive the MR signals as a receiving coil. In other words, the local coil 20 can be used for transmission only, for reception only, or for both transmission and reception. The local coil 20 is one aspect of the RF coil.

The bed 500 includes a bed body 50 and a table 51. The bed body 50 can move the table 51 in the vertical direction and in the horizontal direction, and moves the table 51 with the object P placed thereon to a predetermined height before imaging. Afterward, the bed body 50 moves the table 51 in the horizontal direction so as to move the object P to the inside of the bore.

The control cabinet 300 includes the three gradient coil power supplies 31 (31*x* for the X-axis, 31*y* for the Y-axis, and 31*z* for the Z-axis), the RF transmitter 32, an RF receiver 33, and a sequence controller 34.

The gradient coil power supplies 31 are composed of: the gradient coil power supply 31*x* for the channel for driving the gradient coil configured to generate the gradient magnetic field in the X-axis direction; the gradient coil power supply 31*y* for the channel for driving the gradient coil configured to generate the gradient magnetic field in the Y-axis direction; and the gradient coil power supply 31*z* for the channel for driving the gradient coil configured to generate the gradient magnetic field in the Z-axis direction. The gradient coil power supplies 31*x*, 31*y*, and 31*z* output the current independently for each channel by following instructions from the sequence controller 34.

The RF transmitter 32 generates RF signals on the basis of instructions from the sequence controller 34. The RF transmitter 32 transmits the generated RF signals to the RF coil (i.e., the WB coil 12 or the local coil 20). The RF transmitter 32 is configured as an RF amplifier 32 according to the embodiment. A detailed description of the RF amplifier 32 according to the embodiment will be described below.

The MR signals detected by the WB coil 12 and/or the local coil 20 are received by the RF receiver 33. The RF receiver 33 performs analog-to-digital (A/D) conversion of the MR signals acquired from the WB coil 12 and/or the local coil 20, and outputs the digitized MR signals to the sequence controller 34. Data of the digitized MR signals are referred to as raw data.

The sequence controller 34 performs a scan of the object P by driving the gradient coil power supplies 31, the RF transmitter 32, and the RF receiver 33 under the control of the image processing device 400. When the sequence controller 34 receives the raw data acquired by a scan from the RF receiver 33, the sequence controller 34 transmits the raw data to the image processing device 400.

The sequence controller 34 includes processing circuitry (not shown). This processing circuitry is configured as a processor configured to execute predetermined programs and/or hardware such as an FPGA (Field Programmable Gate Array) and an ASIC (Application Specific Integrated Circuit), for example.

Next, the image processing device 400 will be described. The image processing device 400 includes processing circuitry 40, a memory 41, a display 42, an input interface 43, and a communication circuit 44.

The processing circuitry 40 includes a special-purpose or general-purpose processor, and implements various functions by software processing of executing the programs stored in the memory 41 or directly incorporated into the processing circuitry 40. The processing circuitry 40 controls the operation of the sequence controller 34, and implements the function of generating MR images by performing imaging in accordance with a pulse sequence. The processing circuitry 40 may be configured of hardware such as an FPGA and an ASIC. Additionally, the processing circuitry 40 may implement the various functions by combining hardware processing and software processing.

The memory 41 is a recording medium including: a semiconductor memory element such as a RAM (Random Access Memory) and a flash memory; and an external memory device such as a hard disk drive and an optical disc device. The memory 41 may be a portable medium such as a USB (Universal Serial Bus) memory and a DVD (Digital Video Disk). The memory 41 stores various processing programs to be executed by the processing circuitry 40, data necessary for executing the programs, and medical images.

The display 42 is configured as a general display output device such as a liquid crystal display and an OLED (Organic Light Emitting Diode) display. The display 42 displays various information items under the control of the processing circuitry 40. In addition to being a display device, the display 42 may also be a GUI (Graphical User Interface) that can receive various operations from the user, as exemplified by a touch panel.

The input interface 43 includes: an input device that can be operated by the user; and an input circuit that outputs a command signal from the input device. The input device is achieved by a trackball, a switch, a mouse, a keyboard, a touch pad, a touch screen, a non-contact input device using an optical sensor, and/or a voice input device, for example. When the input device is operated by the user, the input circuit generates a command signal corresponding to the operation, and outputs the generated signal to the processing circuitry 40.

The communication circuit 44 includes an interface for wired or wireless communication connected to a network. The communication circuit 44 can exchange various data between the network and the memory 41, for example.

The image processing device 400 controls the entirety of the MRI apparatus 1 by using each of these components. Specifically, the processing circuitry 40 receives instructions and various information items including imaging conditions through operations on the input interface 43 by the user such as a medical imaging technologist. The processing circuitry 40 causes the sequence controller 34 to perform a scan on the basis of the inputted imaging conditions, and then reconstructs images on the basis of the raw data transmitted from the sequence controller 34. The reconstructed images are displayed on the display 42 and stored in the memory 41.

As described above, the RF amplifier 32 generates the RF signal on the basis of the instructions from the sequence controller 34. More specifically, the RF amplifier 32 amplifies the inputted RF signal and outputs the amplified RF signal to a load that includes at least the RF coil and the object P.

The RF amplifier 32 is designed in such a manner that the input impedance and the output impedance match each other at a predetermined reference load impedance. The reference load impedance is, for example, 50Ω±j0Ω. However, in some cases, the RF amplifier 32 is brought into the state of load mismatch (i.e., impedance mismatch) in which the input and output impedances do not match.

The impedance mismatch is caused by variation in the load impedance and/or variation in temperature of a power amplification element of an RF amplification circuit 315, for example. The load impedance varies depending on weight, height, and body-fat amount of each object P, a type of the RF coil, a position and movement of the object P with respect to the RF coil, for example.

When the impedance mismatch occurs due to variation in the load impedance and/or variation in temperature of the power amplification element, the linearity of the input/output characteristics of the RF amplifier 32 degrades. The RF amplifier 32 of the MRI apparatus 1 according to the embodiments can satisfactorily maintain linearity of the RF amplifier 32 even when the load impedance varies in the load including at least the RF coil and the object P. Hereinafter, a detailed description will be given of the RF amplifier 32.

First Embodiment

Figure 2:
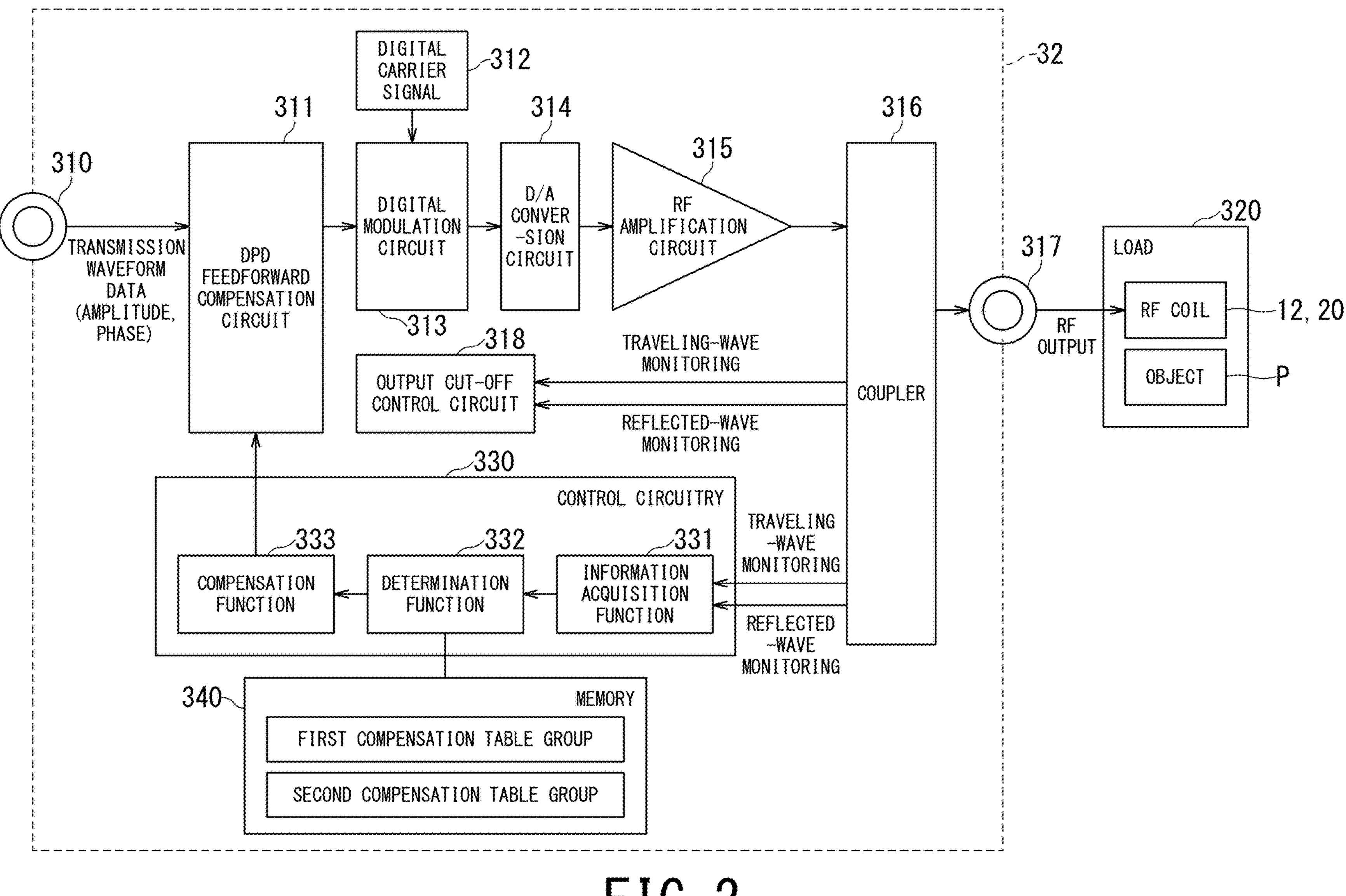
FIG. 2 is a block diagram illustrating a configuration of an RF amplifier according to the first embodiment.

FIG. 2 is a block diagram illustrating a configuration of the RF amplifier 32 according to the first embodiment. As shown in FIG. 2, the RF amplifier 32 includes an input terminal 310, a DPD (Digital Pre-Distortion) feedforward compensation circuit 311, a digital modulation circuit 313, a D/A (digital to analog) conversion circuit 314, an RF amplification circuit 315, a coupler 316, an output terminal 317, control circuitry 330, and a memory 340.

The RF amplifier 32 is connected to the sequence controller 34 via the input terminal 310. The sequence controller 34 outputs transmission waveform data defining the transmission power and/or an amplitude and a phase of the transmission waveform to the RF amplifier 32.

Under the control of the control circuitry 330, the DPD feedforward compensation circuit 311 performs processing of compensating the nonlinearity of the input/output characteristics of the RF amplifier 32 on the inputted transmission waveform data such that the input/output characteristics become linear. When the state of impedance mismatch occurs between the RF amplification circuit 315 and the load 320 due to variation in the load impedance, a reflected wave from the load 320 is generated and the linearity of the RF amplification circuit 315 is degraded. Although it is ideal to keep the gain of the RF amplification circuit 315 constant, the degradation of linearity means that the input/output characteristics of the RF amplification circuit 315 are no longer linear and the gain of the RF amplification circuit 315 changes depending on the magnitude of the input signal. Furthermore, the degradation of linearity means that the waveform of the RF signal inputted to the RF amplification circuit 315 is distorted at the output of the RF amplification circuit 315.

Thus, the DPD feedforward compensation circuit 311 has the role of pre-distorting the waveform of the RF signal to be inputted to the RF amplification circuit 315 in such a manner that the distortion generated in the RF amplification circuit 315 is canceled out. Specifically, the DPD feedforward compensation circuit 311 adjusts the amplitude and phase of the transmission waveform corresponding to the inputted transmission waveform data for each amplitude of the transmission waveform to generate inverse distortion for canceling out the distortion generated in the RF amplification circuit 315.

In this manner, in the stage prior to amplification of the input signal by the RF amplification circuit 315, the nonlinearity of the RF amplifier 32 is compensated for each amplitude of the input signal. The nonlinearity compensation which compensates for the nonlinearity of the RF amplifier 32 is performed by adjusting the amplitude and phase of the input signal. The nonlinearity compensation may be referred to as nonlinearity correction. As a result, the relationship between the RF signal to be inputted to the RF amplifier 32 and the amplified RF signal to be outputted is controlled with high precision. In other words, the nonlinearity of the RF signal to be outputted from the RF amplification circuit 315 is compensated by the DPD feedforward compensation for each amplitude of the inputted RF signal.

The digital modulation circuit 313 digitally modulates the input signal compensated by the DPD feedforward compensation circuit 311 by using a digital carrier signal 312. In other words, the input signal is up-converted in the digital domain. Thereafter, the input signal subjected to the digital modulation is converted into an analog signal by the D/A conversion circuit 314 and then inputted to the RF amplification circuit 315.

The RF amplification circuit 315 amplifies the inputted RF signal and then outputs the amplified signal. The RF amplification circuit 315 amplifies the input signal, amplitude and phase of which have been compensated by the DPD feedforward compensation circuit 311. The amplified signal outputted from the RF amplification circuit 315 is supplied to the RF coil via the output terminal 317. The RF amplification circuit 315 amplifies the inputted RF signal by using a power amplification element such as a FET (Field Effect Transistor), for example.

The coupler 316 is a directional coupler provided between the RF amplification circuit 315 and the output terminal 317. The coupler 316 outputs the amplified signal outputted from the RF amplification circuit 315 to the output terminal 317. The output terminal 317 outputs the amplified signal amplified by the RF amplification circuit 315 to the RF coil. In other words, the RF amplifier 32 amplifies the inputted RF signal and then outputs the amplified RF signal to the load 320, which includes at least the RF coil and the object P.

In addition, the coupler 316 can extract both the traveling-wave power (hereinafter abbreviated as the forward power) of the amplified signal and the reflected-wave power (hereinafter abbreviated as the reflected power) from the output terminal 317 for monitoring and output both to the control circuitry 330. The RF amplifier 32 may further include an output cut-off control circuit 318. When the output cut-off control circuit 318 is provided, the coupler 316 outputs the forward power, the reflected power, and the monitoring result also to the output cut-off control circuit 318. The output cut-off control circuit 318 stops the operation of the RF amplifier 32 when detecting an abnormal state such as a short circuit and overload in the monitoring results of the forward power and the reflected power of the amplified signal.

The control circuitry 330 is a processor that implements functions corresponding to various programs by reading out predetermined programs from the memory 340 and executing them. The memory 340 stores the various programs to be executed by the control circuitry 330, data necessary for executing the programs, and a plurality of nonlinearity compensation tables and arithmetic expressions for determining compensation data described below.

The control circuitry 330 includes an information acquisition function 331, a determination function 332, and a compensation function 333. The nonlinearity compensation of the RF amplifier 32 is performed by adjusting the amplitude and phase of the input signal. The overall flow of the nonlinearity compensation of the RF amplifier 32 according to the first embodiment will be described by using the flowchart of FIG. 3.

In the following description, a second scan refers to performing a main scan of the object P in order to obtain an MR image for diagnosis, for example. In addition, a first scan refers to performing a pre-scan of the object P before the second scan for tuning or calibration to secure satisfactory image quality in MR image acquisition for positioning and imaging in the second scan, for example. The first scan may be performed in advance for each second scan or one first scan may be performed for a plurality of second scans. Prior to start of the processing shown in the flowchart of FIG. 3, the load 320 including at least the RF coil and the object P is carried into the bore inside the static magnetic field magnet 10.

In the step ST10, the processing circuitry 40 of the image processing device 400 controls the entirety of the MRI apparatus 1 and starts the first scan. The first scan is started in response to a user's operation on the input interface 43, for example. The processing circuitry 40 instructs the sequence controller 34 to prepare for the first scan on the basis of various imaging conditions and to start the first scan. The sequence controller 34 controls the gradient coil power supplies 31, the RF transmitter (i.e., RF amplifier) 32, and the RF receiver 33 so as to execute the first scan of the object P.

In the step ST20, the information acquisition function 331 acquires load impedance information of the load in the first scan. The load impedance information is acquired by monitoring the forward power of the amplified signal from the coupler 316 and the reflected power from the output terminal 317 and outputting them to the control circuitry 330, for example. The method of acquiring the load impedance information is not limited to the above-described method, and any known acquisition method that can acquire at least one of the load impedance information items shown below may be used.

The load impedance information includes, for example, (a) a complex load impedance, (b) a complex load admittance, (c) a voltage standing wave ratio (VSWR) and a phase angle between the traveling wave and the reflected wave, and (d) a complex reflection coefficient, and (e) an S11 parameter. The traveling wave may be referred to as an incident wave.

The load impedance information is used to determine compensation data for compensating the nonlinearity of the RF signal to be outputted from the RF amplification circuit 315 for each amplitude of the inputted RF signal in the step ST40 as described below.

(a) The complex load impedance is a complex impedance of the load in which the real part of the complex load impedance represents resistance component of the load and the imaginary part of the complex load impedance represents reactance component of the load, and is defined by the ratio between a complex voltage and a complex current.

(b) The complex load admittance is a complex admittance of the load in which the real part of the complex load admittance represents conductance component of the load and the imaginary part of the complex load admittance represents susceptance component of the load, and is defined as the reciprocal of the complex load impedance.

(c) The voltage standing wave ratio is the ratio between the maximum amplitude and the minimum amplitude in a standing wave composed of a traveling wave and a reflected wave, and the phase angle between the traveling wave and the reflected wave is also called an initial phase.

(d) The complex reflection coefficient is a complex number that includes the phase in the amplitude reflection coefficient, which is defined as the amplitude ratio between the reflected wave and the traveling wave.

(e) The S11 parameter is a reflection characteristic to be measured by using a network analyzer, for example.

In the step ST40 subsequent to completion of the first scan in the step ST30, on the basis of the load impedance information, the determination function 332 determines the compensation data for compensating the nonlinearity of the RF signal to be outputted from the RF amplification circuit 315 for each amplitude of the inputted RF signal.

The compensation data are determined by being selected from a plurality of nonlinearity compensation tables. The plurality of nonlinearity compensation tables are data tables that correspond to a plurality of load impedances. The plurality of nonlinearity compensation tables are stored in the memory 340, for example. From among the plurality of nonlinearity compensation tables, the determination function 332 selects the nonlinearity compensation table for compensating the amplitude and phase of the inputted RF signal for each amplitude on the basis of the load impedance information, and determines the selected nonlinearity compensation table as the compensation data.

The plurality of nonlinearity compensation tables will be described by using FIG. 4 to FIG. 7.

Figure 4:
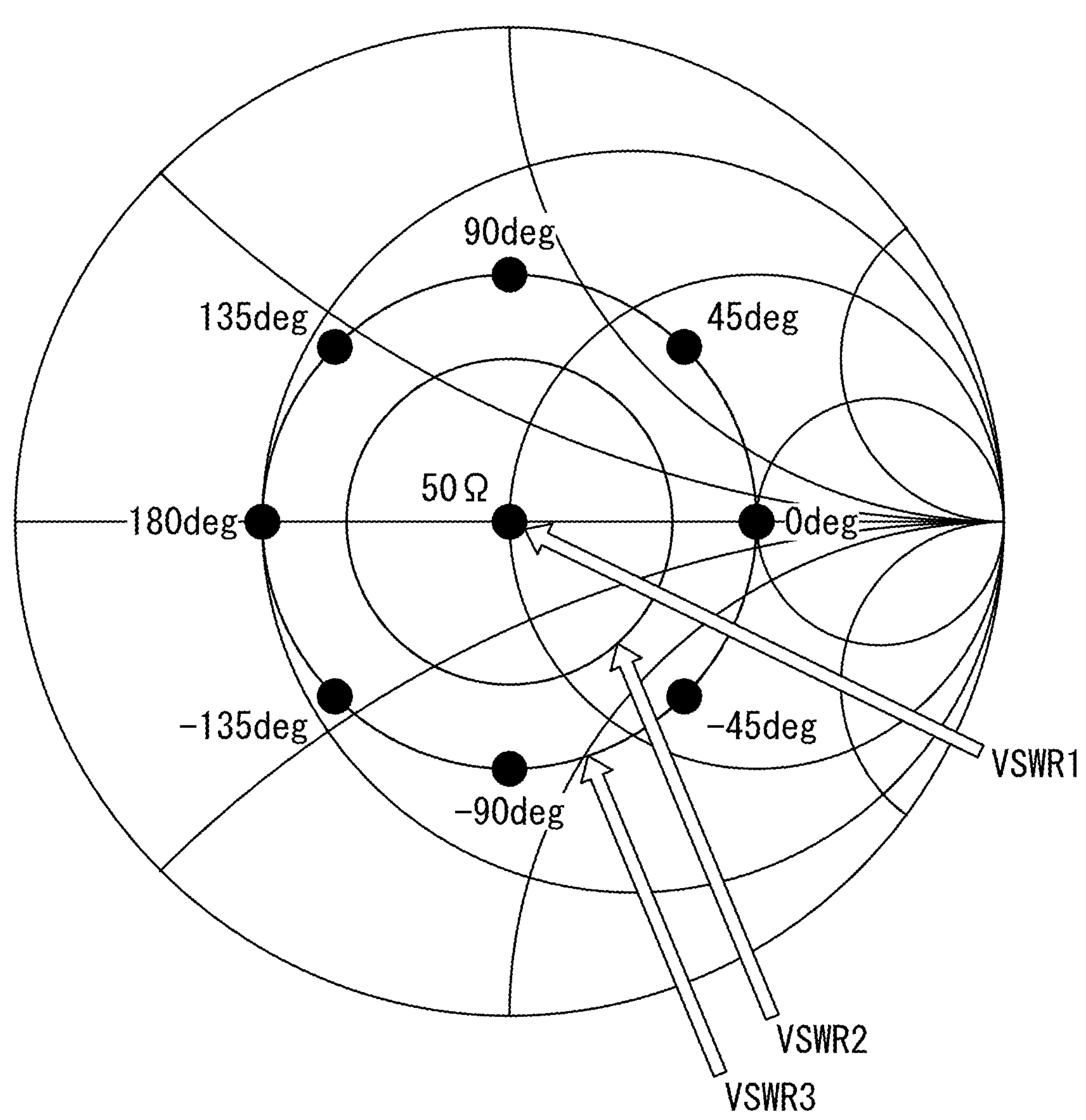
FIG. 4 is a schematic diagram of a Smith chart that represents complex impedances.

FIG. 4 is a schematic diagram of a Smith chart that represents complex impedances. In FIG. 4, each concentric circle representing VSWR and each phase angle φ between the traveling wave and the reflected wave are plotted on the Smith chart. The center of the Smith chart corresponds to the reference load impedance (for example, 50Ω) of the RF amplification circuit 315, and also corresponds to the position of VSWR=1.0. In the Smith chart, the load impedance can be associated with the VSWR and the phase angle φ (i.e., phase angle φ between the traveling wave and the reflected wave). For example, in the Smith chart, if the load impedance changes to a value different from the reference load impedance of 50Ω and moves from the center of the Smith chart toward the outer circumference of the circle, it can be seen that the VSWR changes from the center position of 1.0 to 2.0 or 3.0 and the phase angle φ between the traveling wave and the reflected wave changes from −180° to +180°.

When the load impedance (i.e., complex load impedance) differs from the reference load impedance, the linearity of the RF amplification circuit 315 changes from the ideal state, and the state of change in linearity of the RF amplification circuit 315 differs depending on the value of the load impedance. Thus, the compensation data for compensating the nonlinearity of the RF signal to be outputted from the RF amplification circuit 315 for each amplitude of the inputted RF signal differs depending on the value of the load impedance.

There is a one-to-one correspondence between the complex load impedance and the combination of the VSWR and the phase angle. The compensation data for compensating the nonlinearity of the RF signal to be outputted from the RF amplification circuit 315 for each amplitude of the inputted RF signal differs depending on the combination of values of the VSWR and the phase angle. The combination of values of the VSWR and the phase angle φ are, for example, as follows: VSWR=1.0 and phase angle φ=0°; VSWR=1.2 and phase angle φ=10°; VSWR=1.4 and phase angle φ=15°; VSWR=1.6 and phase angle φ=20°; and VSWR=2.0 and phase angle φ=30°.

Figure 5:
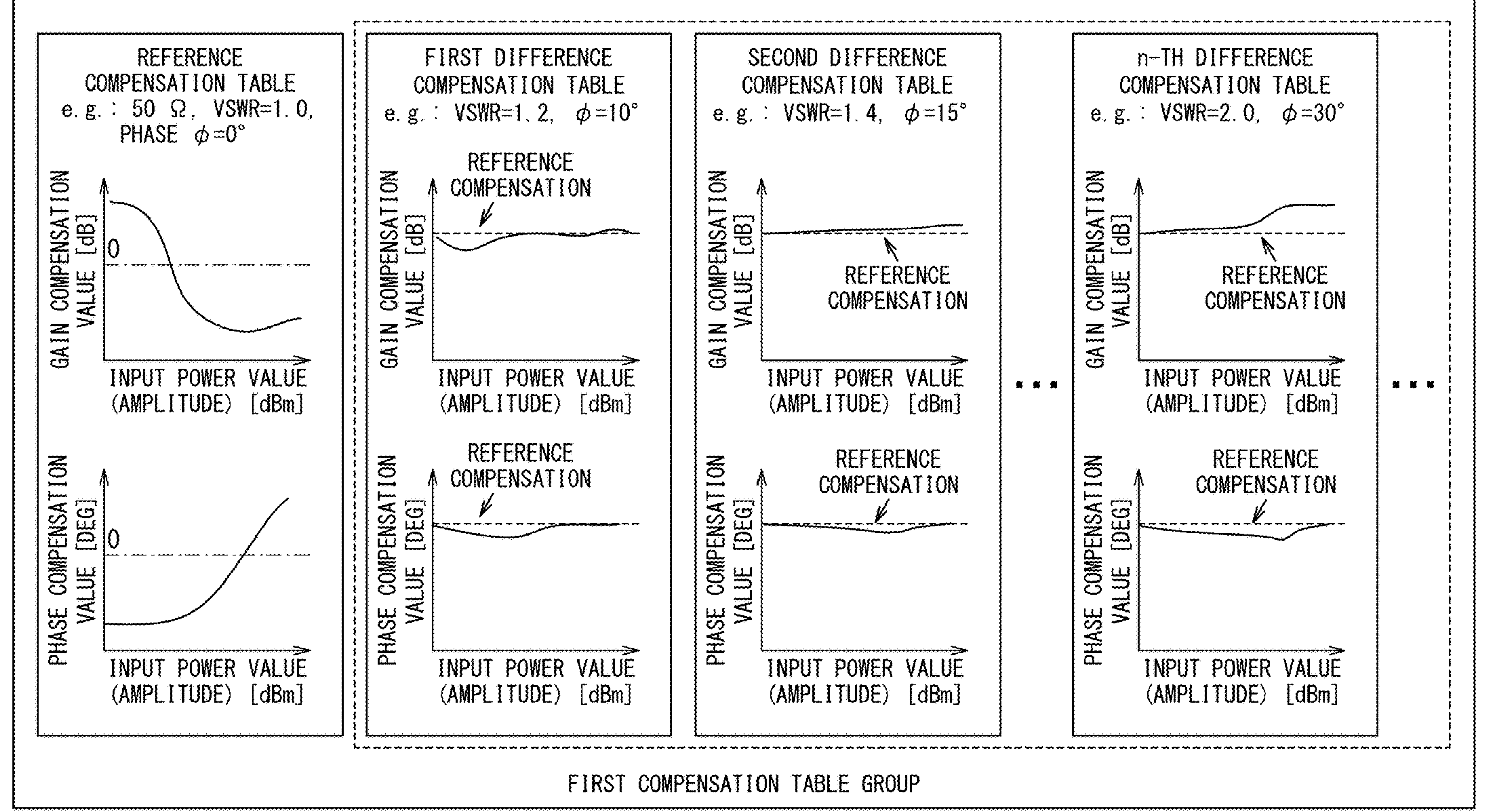
FIG. 5 is a schematic diagram of a first compensation table group according to the first embodiment.
Figure 7:
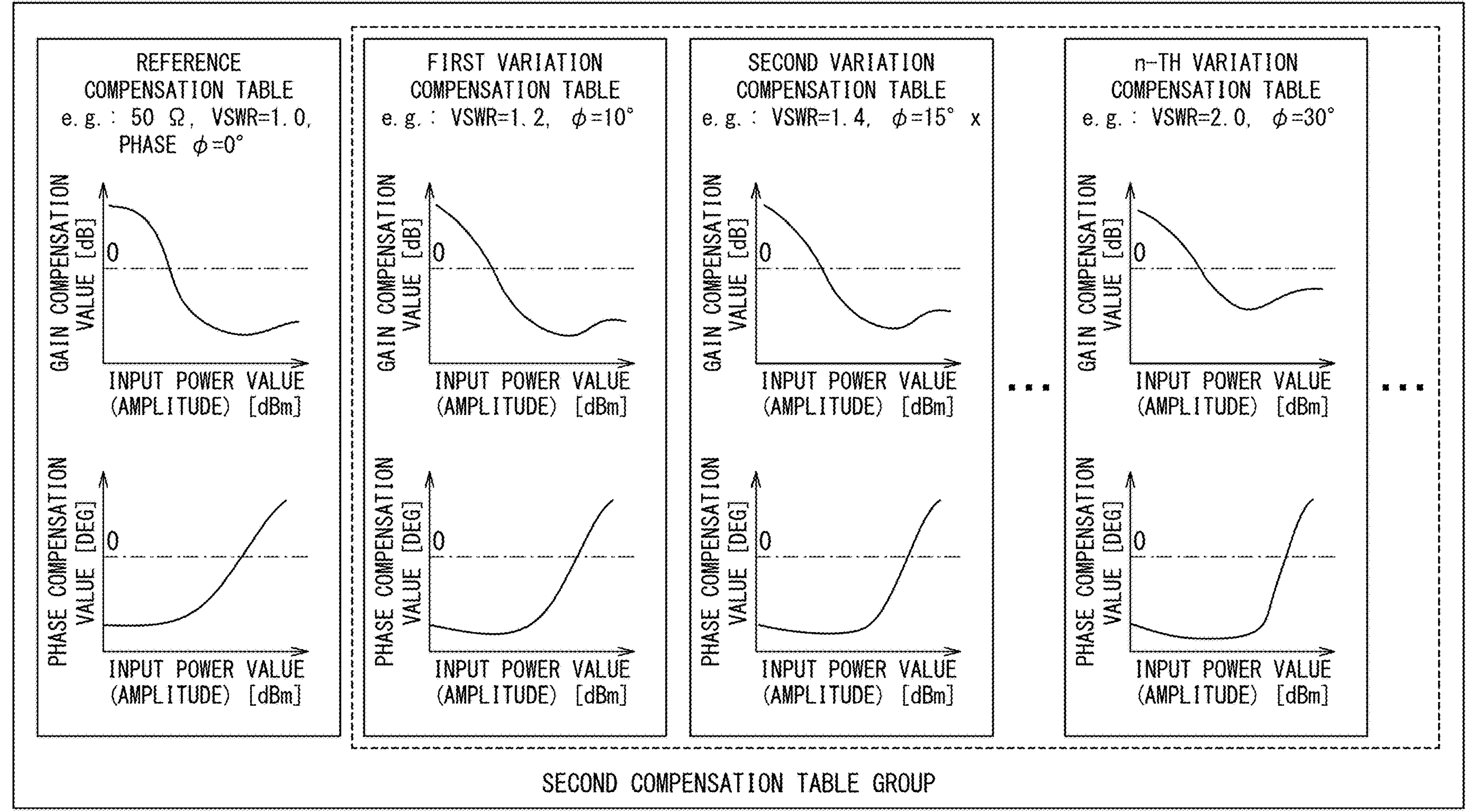
FIG. 7 is a schematic diagram of a second compensation table group according to the first embodiment.

Thus, when a plurality of compensation data for compensating respective nonlinearities are prepared in advance, the appropriate compensation data for compensation of the actual load 320 can be determined even if the load impedance varies depending on the load 320. The nonlinearity compensation tables are one aspect of the compensation data. The nonlinearity compensation tables, such as difference compensation tables as shown in FIG. 5 and variation compensation tables as shown in FIG. 7, are prepared for each combination of the VSWR and the phase angle φ. Each of the nonlinearity compensation tables uniquely provides a preferable combination of a gain compensation value and a phase compensation value for the power value (i.e., amplitude) of the inputted RF signal.

The plurality of nonlinearity compensation tables are data tables that can be calculated or generated in advance during development and manufacturing of the RF amplifier 32 and are stored in the memory 340, for example. Generating and storing the plurality of nonlinearity compensation tables in advance eliminates the need to generate the nonlinearity compensation table(s) for actually compensating the variation in the load 320 at a facility such as a hospital where the MRI apparatus 1 is installed.

FIG. 5 is a schematic diagram of a first compensation table group that is one aspect of the plurality of nonlinearity compensation tables. As shown in FIG. 5, the plurality of nonlinearity compensation tables are composed of a reference nonlinearity compensation table corresponding to a predetermined reference load impedance and at least one difference compensation table. The difference compensation table is a nonlinearity compensation table corresponding to a difference load impedance, which is the difference between the reference load impedance and the varying load impedance. In other words, the compensation table is the difference between the reference nonlinearity compensation table and a variation nonlinearity compensation table, which corresponds to the varying load impedance different from the reference load impedance. The reference load impedance is 50Ω, for example.

The reference nonlinearity compensation table corresponding to the predetermined reference load impedance differs between the individual products of the RF amplifier 32. Thus, it is preferred that the compensation data corresponding to the predetermined reference load impedance are acquired for each RF amplifier 32 during manufacturing, for example. Contrastively, the difference compensation tables do not differ between the individual products of the RF amplifier 32. Hence, once the compensation data are acquired, the acquired compensation data can be used for other RF amplifiers of the same design during development, for example. In other words, the difference compensation tables can be used in common for other RF amplifiers having the same configuration as the RF amplifier 32.

Figure 6:
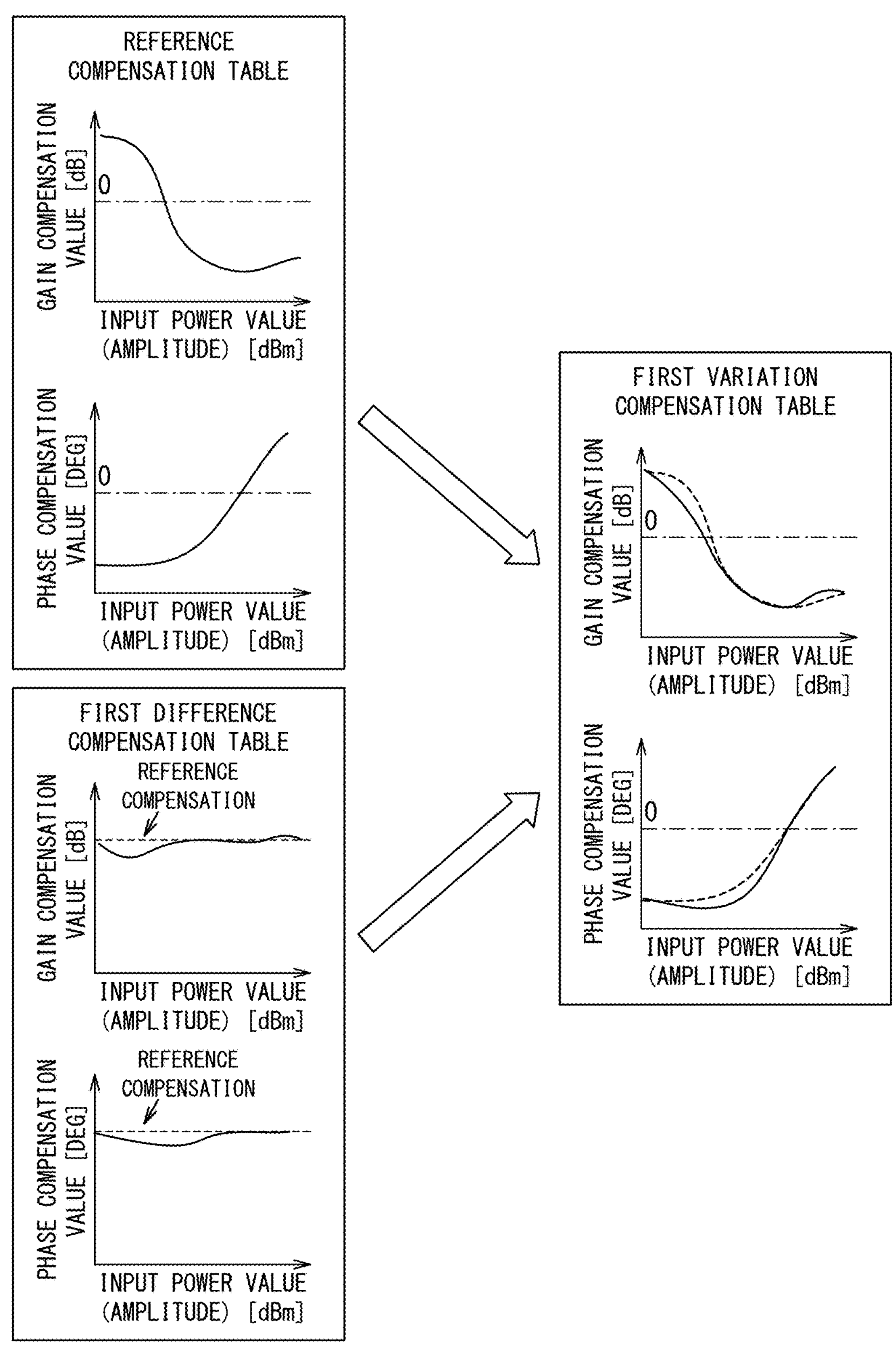
FIG. 6 is a schematic diagram illustrating a case of generating a variation compensation table from a reference compensation table and a difference compensation table.

FIG. 6 is a schematic diagram illustrating the reference compensation table, the difference compensation table, and the variation compensation table. As shown in FIG. 6, the variation compensation table can be generated by combining the reference compensation table and the difference compensation table. As can be seen in FIG. 6, the reference compensation table and the difference compensation tables may be combined in advance to generate a plurality of variation compensation tables corresponding to different load impedances or different combinations of the VSWR and the phase angle so that the variation compensation tables are stored as a second compensation table group.

FIG. 7 is a schematic diagram of the second compensation table group, which is one aspect of the plurality of nonlinearity compensation tables. As shown in FIG. 7, for example, the plurality of the nonlinearity compensation tables are composed of the reference nonlinearity compensation table corresponding to the predetermined reference load impedance and at least one variation nonlinearity compensation table, which corresponds to the varying load impedance different from the reference load impedance. The reference impedance is 50Ω, for example. Although both the first compensation table group and the second compensation table group are stored in the memory 340 in FIG. 2, the MRI apparatus 1 may be configured such that only one of both is stored.

Returning to FIG. 3, in the step ST50, for example, in response to a user's operation via the input interface 43, the processing circuitry 40 of the image processing device 400 controls the entirety of MRI apparatus 1 and starts the second scan.

Figure 8:
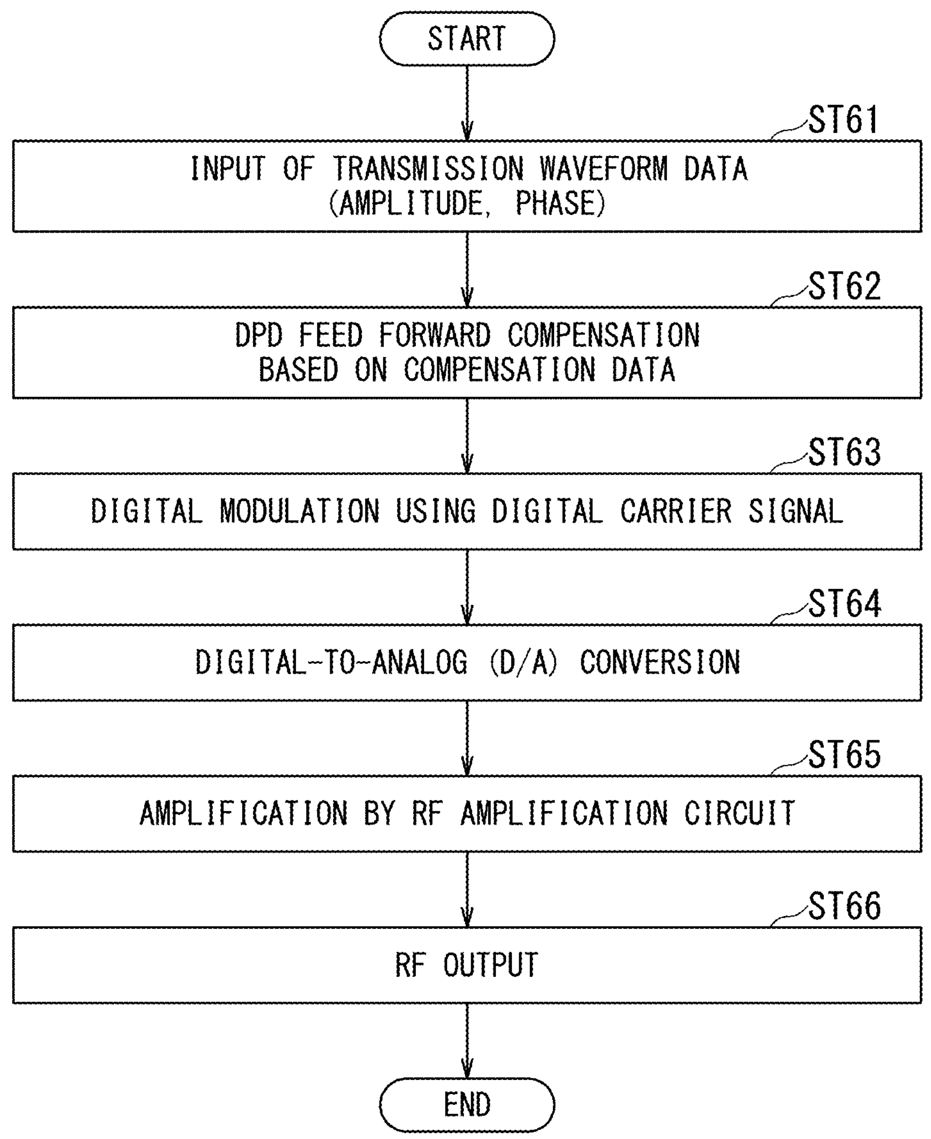
FIG. 8 is a flowchart illustrating a flow until an inputted RF signal is outputted in nonlinearity compensation of the RF amplifier according to the first embodiment.

In the step ST60, i.e., in the second scan, the compensation function 333 compensates for the RF signal to be outputted from the RF amplification circuit 315 for each amplitude of the inputted RF signal on the basis of the determined compensation data. A detailed description will be given of one case for the flow of the step ST60 composed of the steps ST61 to ST66 by using the flowchart of FIG. 8.

In the step ST61, the transmission waveform data are inputted from the sequence controller 34 to the RF amplifier 32.

In the step ST62, the DPD feedforward compensation circuit 311 compensates for the nonlinearity of the RF amplifier 32 under the control of the control circuitry 330. The DPD feedforward compensation circuit 311 compensates for the nonlinearity of the RF amplifier 32 by adding or subtracting the gain compensation value and the phase compensation value required for the power value (amplitude) of the inputted RF signal to/from each of the amplitude and the phase of the transmission waveform corresponding to the inputted transmission waveform data, for example. The amplitude compensation value and the phase compensation value are obtained from the compensation data such as the reference compensation table and the variation compensation table, for example.

In the step ST63, the digital modulation circuit 313 performs digital modulation on the input signal compensated by the DPD feedforward compensation circuit 311 by using the digital carrier signal 312.

In the step ST64, the input signal subjected to the digital modulation is converted into an analog signal by the D/A conversion circuit 314.

In the step ST65, the RF amplification circuit 315 amplifies the inputted RF signal and then outputs the amplified RF signal.

In the step ST66, the RF signal amplified by the RF amplification circuit 315 is outputted to the RF coil via the output terminal 317. In other words, the RF amplifier 32 amplifies the inputted RF signal and outputs it to the load 320, which includes at least the RF coil and the object P.

Returning to FIG. 3, in the step ST70, when the second scan is completed, the processing of this flowchart is completed.

Figure 9:
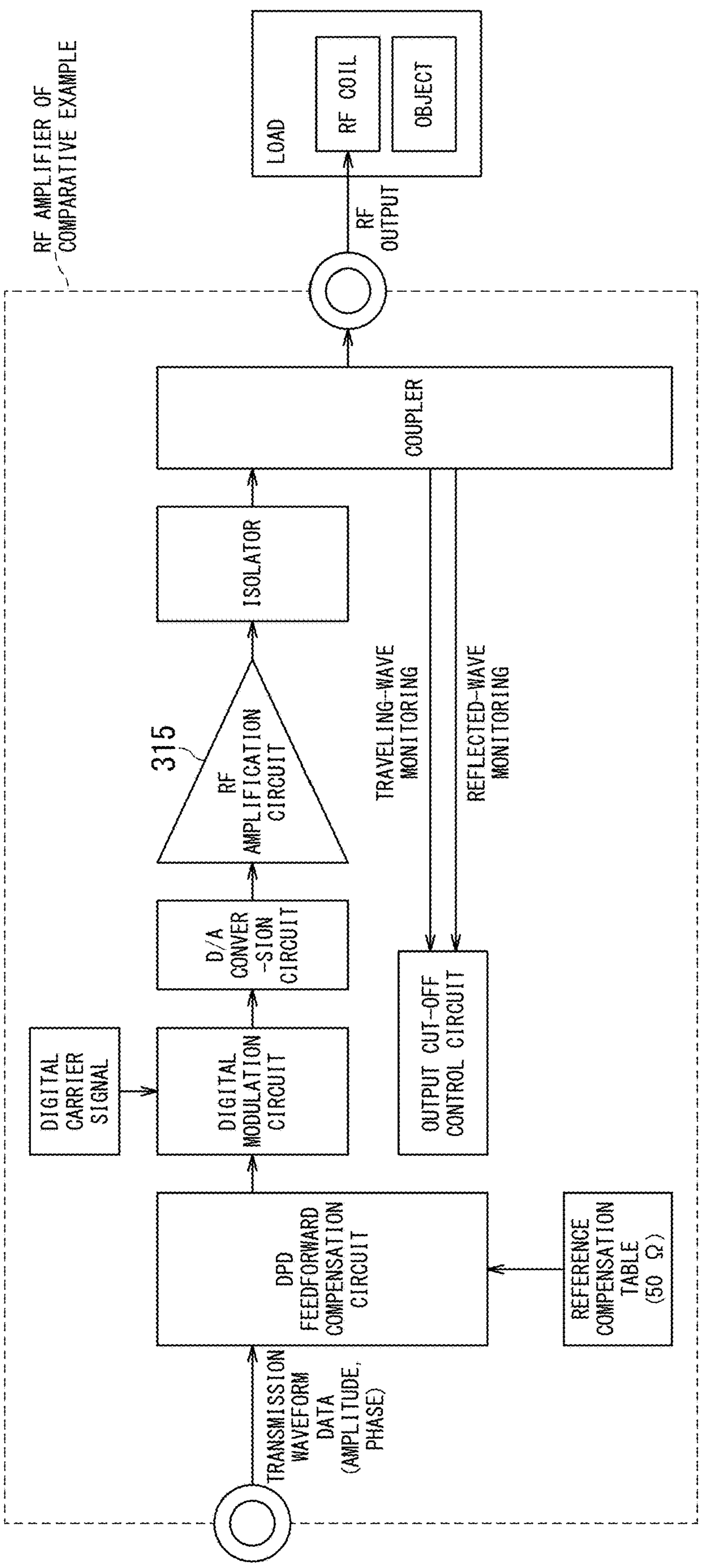
FIG. 9 is a block diagram illustrating a configuration of an RF amplifier of a comparative example.

FIG. 9 is a schematic diagram illustrating a configuration of a conventional RF amplifier as a comparative example. As shown in FIG. 9, in the RF amplifier of the comparative example, an isolator is provided between the RF amplification circuit and the output terminal. Even if the load impedance varies and the impedance mismatch occurs, the isolator can prevent the reflected power from reaching the RF amplification circuit. As a result, the linearity of the RF amplifier can be maintained even if the load impedance varies. In other words, the comparative example shown in FIG. 9 has a configuration in which the linearity of the RF amplifier is maintained by the presence of the isolator.

In the RF amplifier 32 according to the first embodiment, even if the load impedance varies in the load 320 and the impedance mismatch occurs, the control circuitry 330 compensates for the nonlinearity of the RF amplification circuit 315 by generating inverse distortion in the transmission waveform to be inputted to the RF amplifier 32 depending on the state of the impedance mismatch. This configuration eliminates the need for an isolator to maintain the linearity of the RF amplification circuit 315, enables downsizing of the RF amplifier 32, and can reduce the manufacturing cost of the RF amplifier 32.

First Modification of First Embodiment

In the step ST40 of the first embodiment, on the basis of the load impedance information, the determination function 332 determines the compensation data for compensating the nonlinearity of the RF signal to be outputted from the RF amplification circuit 315 for each amplitude of the inputted RF signal. In the first embodiment, these compensation data are determined by being selected from the plurality of nonlinearity compensation tables.

In the first modification of the first embodiment, instead of the configuration of storing the nonlinearity compensation tables, the determination function 332 uses arithmetic expressions to calculate nonlinearity compensation values for compensating the amplitude and phase of the inputted RF signal for each amplitude on the basis of the load impedance information, and determines the calculated nonlinearity compensation values as the compensation data. The arithmetic expressions are expressions for calculating nonlinearity compensation values that compensate for the plurality of nonlinearities corresponding to the plurality of load impedances. The arithmetic expressions are stored, for example, in the memory 340. The arithmetic expressions are, for example, an approximation formula that approximates the plurality of nonlinearity compensation tables obtained in advance and/or known formulas.

Second Modification of First Embodiment

In the step ST40 of the first embodiment, the nonlinearity compensation tables to be used in determining the compensation data may include more nonlinearity compensation tables near the load impedances of loads assumed to be frequent in the first and second scans than nonlinearity compensation tables near the load impedances of loads assumed to be infrequent.

For example, the linearity compensation tables to be used in determining the compensation data may include more linearity compensation tables for loads that are assumed to appear frequently in the first and second scans in terms of imaging conditions such as the type of RF coil to be used and object conditions such as weight, height, and body-fat amount of the individual objects. For example, when the nonlinearity compensation tables are usually generated with the VSWR in 0.1 increments and the phase angle φ in 5° increments, the accuracy of nonlinearity compensation for loads assumed to appear frequently may be further improved by generating the linearity compensation tables with the VSWR in 0.05 increments and the phase angle φ in 1° increments.

In addition, the total number of the nonlinearity compensation tables can be reduced by reducing the number of the nonlinearity compensation tables for loads that are assumed to appear less frequently in the first and second scans. When the number of nonlinearity compensation patterns (i.e., accuracy of nonlinearity compensation) is enhanced by preparing more linearity compensation tables for loads that are assumed to appear frequently, the linearity compensation table to be used can be selected more appropriately and the precision of the RF signal to be outputted from the RF amplifier can be enhanced.

Second Embodiment

Figure 10:
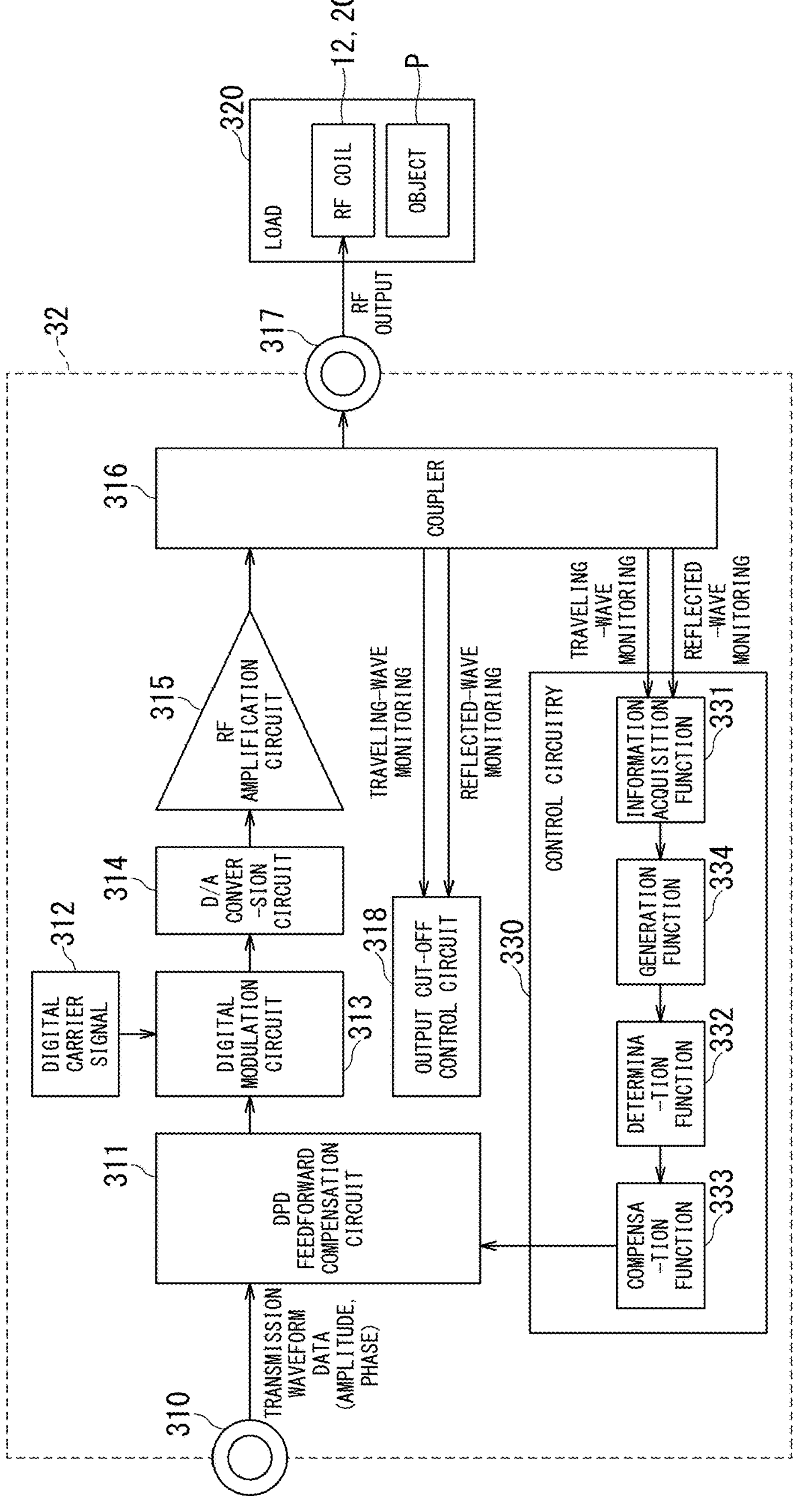
FIG. 10 is a block diagram illustrating a configuration of an RF amplifier according to the second embodiment.

FIG. 10 is a block diagram illustrating a configuration of the RF amplifier 32 according to the second embodiment. As shown in FIG. 10, the second embodiment differs from the first embodiment in that the configuration of the second embodiment further includes a generation function 334 in the control circuitry 330. In FIG. 10, components and functions that are not substantially different from those of the RF amplifier 32 shown in FIG. 2 are denoted by the same reference signs, and duplicate descriptions are omitted.

Figure 3:
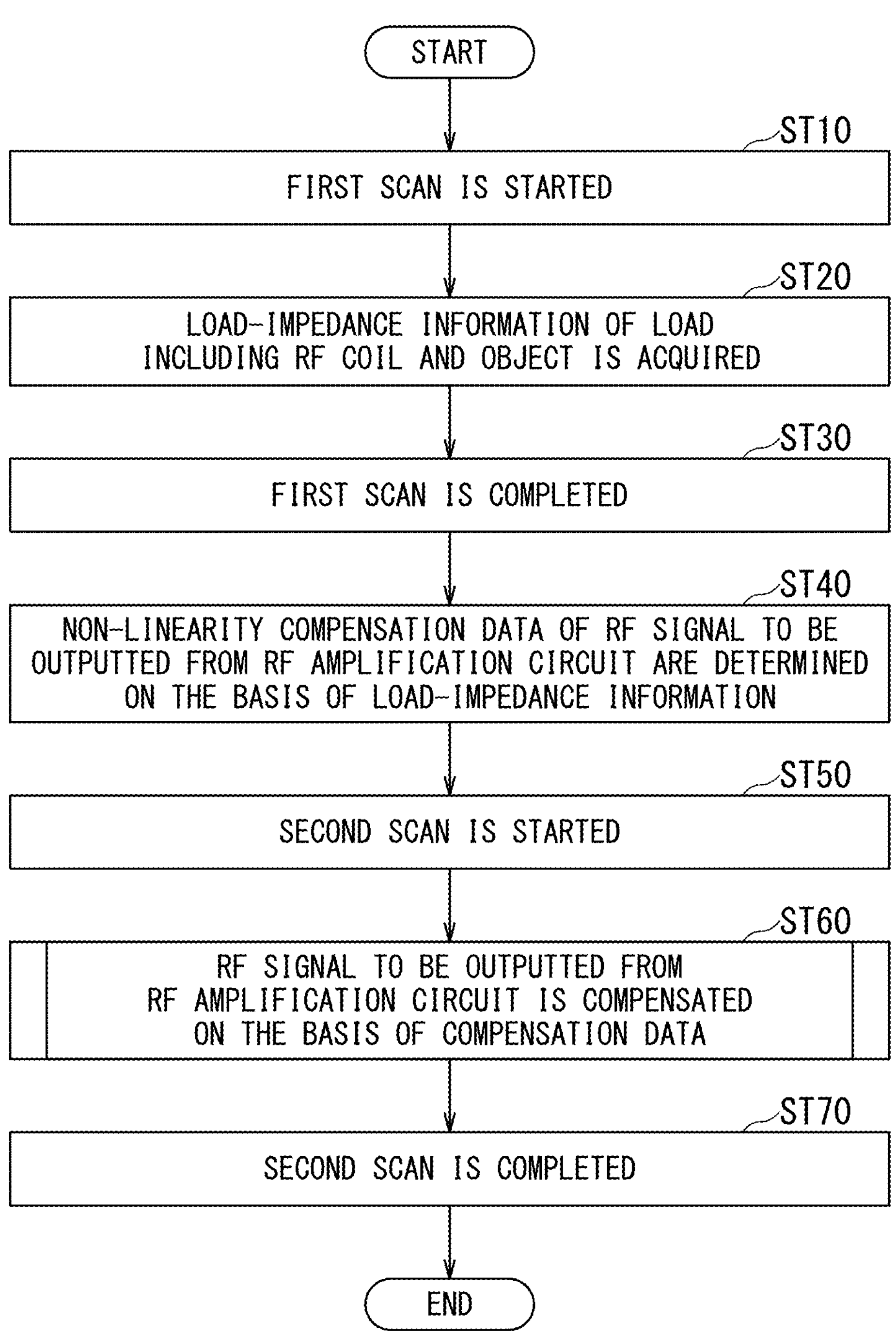
FIG. 3 is a flowchart illustrating an overall flow of nonlinearity compensation of the RF amplifier according to the first embodiment.
Figure 11:
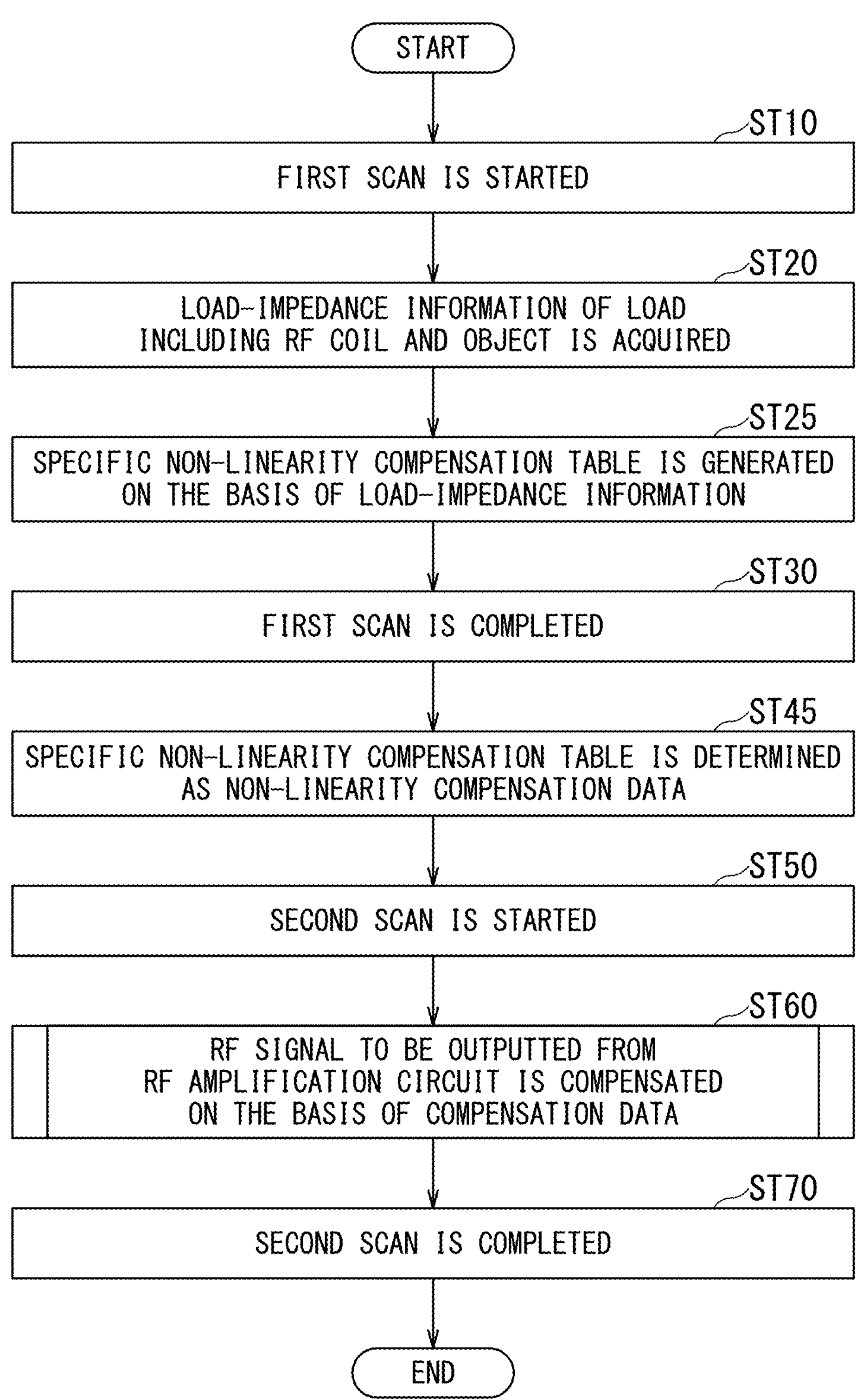
FIG. 11 is a flowchart illustrating an overall flow of nonlinearity compensation of the RF amplifier according to the second embodiment.

In the first embodiment, the nonlinearity compensation data for the RF amplifier 32 are determined by being selected from the plurality of nonlinearity compensation tables. The second embodiment differs from the first embodiment in that the second embodiment uses a specific nonlinearity compensation table generated by the first scan. As shown in the flowchart of FIG. 11, in the RF amplifier 32 according to the second embodiment, the generation function 334 implements the processing of the step ST25, and the determination function 332 implements the processing of the step ST45. Other steps equivalent to the first embodiment shown in FIG. 3 are denoted by the same reference signs, and duplicate descriptions are omitted.

In the RF amplifier 32 according to the second embodiment, in the step ST20 shown in FIG. 11, after the information acquisition function 331 acquires the load impedance information of the load 320 including the RF coil and the object P, the processing of the step ST25 is started.

In the step ST25, the generation function 334 generates a specific nonlinearity compensation table corresponding to the load impedance of the first scan. Although the processing of the step ST25 is performed between the step ST20 and the step ST30 in FIG. 11, the processing of the step ST25 may also be performed after the first scan in the step ST30.

After the first scan in the step ST30, in the step ST45, the determination function 332 determines the specific nonlinearity compensation table generated by the generation function 334 as the compensation data. After the processing of the step ST45, the processing of the steps ST50, ST60, and ST70 are sequentially performed.

According to the RF amplifier 32 of the second embodiment, the specific nonlinearity compensation table corresponding to the actual load impedance is generated in the first scan and used as the compensation data for the second scan. In other words, the compensation data are determined on the basis of the actual load 320 including at least the RF coil and the object P, and thus, the linearity of the RF amplifier 32 can be maintained with high accuracy.

Third Embodiment

Figure 12:
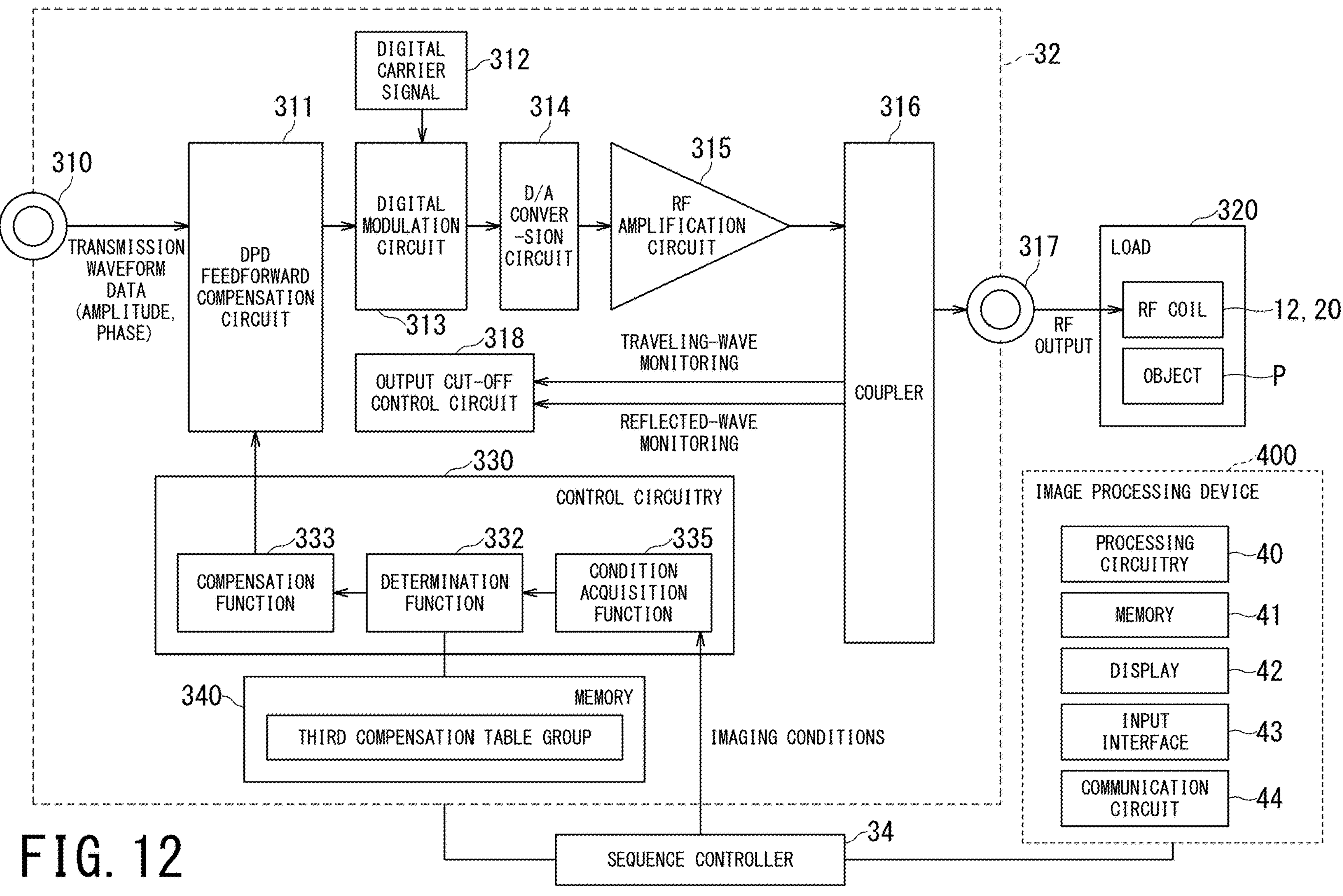
FIG. 12 is a block diagram illustrating a configuration of an RF amplifier according to the third embodiment.

FIG. 12 is a block diagram illustrating a configuration of the RF amplifier 32 according to the third embodiment. As shown in FIG. 12, the third embodiment differs from the first embodiment in that the control circuitry 330 includes a condition acquisition function 335 instead of the information acquisition function 331. In FIG. 12, components and functions that are not substantially different from those of the RF amplifier 32 shown in FIG. 2 are denoted by the same reference signs, and duplicate descriptions are omitted.

Figure 13:
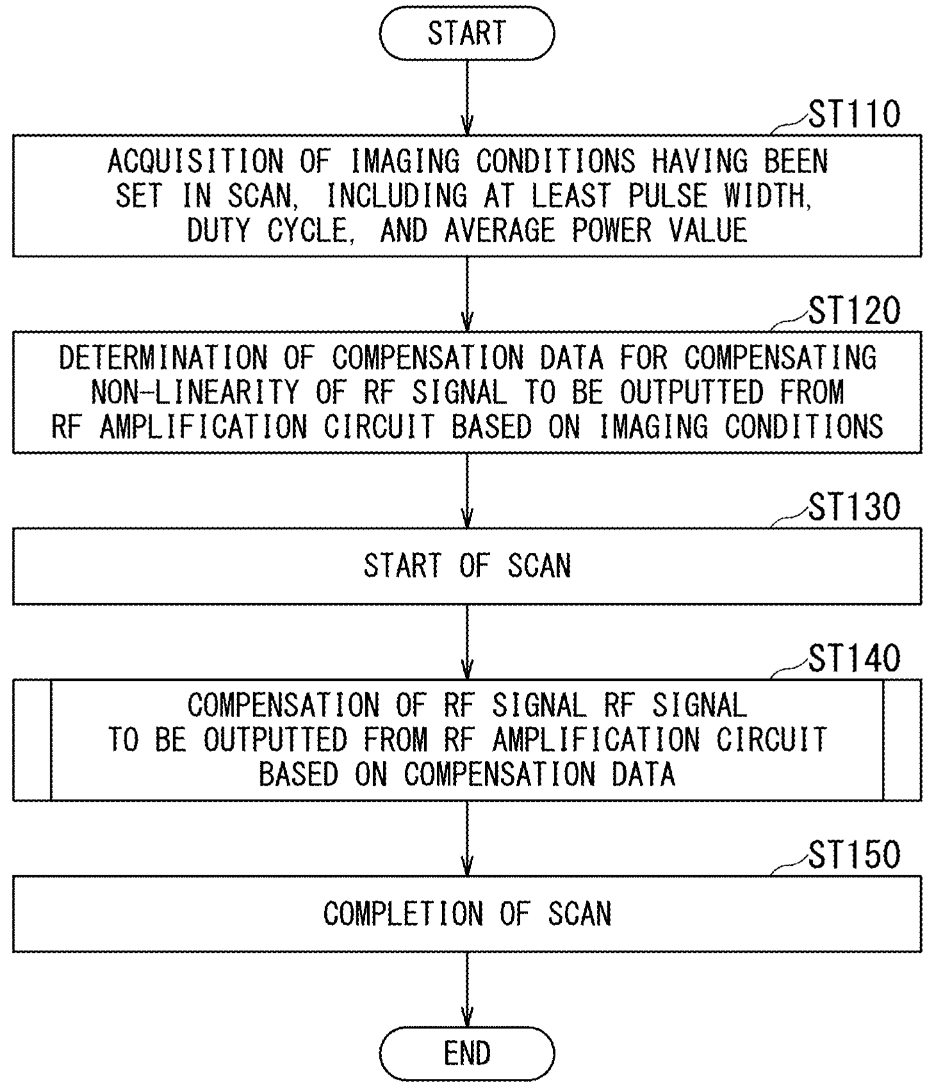
FIG. 13 is a flowchart illustrating an overall flow of nonlinearity compensation of the RF amplifier according to the third embodiment.

In the first embodiment, the nonlinearity compensation data for the RF amplifier 32 are determined on the basis of the load impedance information. The third embodiment differs from the first embodiment in that the nonlinearity compensation data are determined on the basis of imaging conditions having been set during a scan, including at least a pulse width, a duty cycle, and an average power value. One case of the overall flow of nonlinearity compensation of the RF amplifier 32 according to the third embodiment will be described by using the flowchart of FIG. 13. The scan described in FIG. 13 may be the first scan or the second scan.

In the step ST110, the condition acquisition function 335 acquires the imaging conditions having been set in the scan, including at least a pulse width, a duty cycle, and an average power value. Various imaging conditions are set by a user's operation via the input interface 43, for example. The processing circuitry 40 transmits instructions based on the various imaging conditions to the sequence controller 34.

In the step ST120, on the basis of the imaging conditions, the determination function 332 determines the compensation data for compensating the nonlinearity of the RF signal to be outputted from the RF amplification circuit 315 for each amplitude of the inputted RF signal.

The compensation data are determined by being selected from the plurality of nonlinearity compensation tables, for example. The plurality of nonlinearity compensation tables are, for example, a third compensation table group and are stored in the memory 340. The third compensation table group is composed of a plurality of nonlinearity compensation tables for compensating temperature variation of the power amplification element corresponding to combinations of a pulse width, a duty cycle, and an average power value. On the basis of the imaging conditions, the determination function 332 selects the nonlinearity compensation table for compensating the amplitude and phase of the inputted RF signal for each amplitude from among the plurality of nonlinearity compensation tables, and determines the selected table as the compensation data.

Similarly to the first compensation table group and the second compensation table group, the third compensation table group may be configured as respective tables corresponding to specific loads so as to uniquely provide a preferable combination of a gain compensation value and a phase compensation value for the power value (i.e., amplitude) of the inputted RF signal. In this case, the table corresponding to the specific load is selected from the third compensation table group and is used to determine the gain compensation value and the phase compensation value to be actually applied.

In the step ST130, the processing circuitry 40 of the image processing device 400 controls the entirety of the MRI apparatus 1 and starts a scan. For example, the scan is started in response to a user's operation via the input interface 43. For example, the processing circuitry 40 transmits an instruction to start the scan to the sequence controller 34, and transmits instructions based on various imaging conditions to the sequence controller 34. The sequence controller 34 controls the gradient coil power supplies 31, the RF amplifier 32, and the RF receiver 33 so as to perform a scan of the object P.

In the step ST140, on the basis of the determined compensation data, the compensation function 333 compensates for the RF signal to be outputted from the RF amplification circuit 315 during the scan for each amplitude of the inputted RF signal. Since the nonlinearity compensation in the step ST140 is not substantially different from the step ST60 of the RF amplifier 32 according to the first embodiment, duplicate descriptions are omitted.

In the step ST150, when the scan is completed, the processing of this flowchart is completed.

According to the RF amplifier 32 of the third embodiment, the nonlinearity compensation is performed by estimating the temperature variation of the power amplification element in advance from the imaging conditions including a pulse width, a duty cycle, and an average power value. Thus, in the load 320, the influence of the temperature variation on the power amplification element can be compensated by feedforward compensation.

According to at least one embodiment described above, the linearity of the RF amplifier 32 can be satisfactorily maintained under the load that includes at least the RF coil and the object.

In the above-described embodiments, the term "processor" means a circuit such as a special-purpose or general-purpose CPU (Central Processing Unit), a GPU (Graphics Processing Unit), an ASIC, a programmable logic device including an SPLD (Simple Programmable Logic Device) and a CPLD (Complex Programmable Logic Device), and an FPGA, for example. The processor implements various functions by reading in and executing the programs stored in the memory.

Although a description has been given of the case where a single processor of the processing circuitry achieves the respective functions in the above-described embodiments, the processing circuitry may be configured by combining a plurality of independent processors in such a manner that each processor implements each function. Further, when a plurality of processors are provided, a memory for storing the programs may be individually provided for each processor or a single memory may collectively store the programs corresponding to the functions of all the processors.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the scope of the invention as defined by the appended claims.

What is claimed is:

1. An MRI apparatus, comprising:

an RF coil configured to transmit an RF signal to an object; and an RF amplifier configured to output the RF signal to a load including at least the RF coil and the object, wherein the RF amplifier comprises:

an RF amplification circuit configured to amplify an inputted RF signal;

a memory that stores a plurality of nonlinearity compensation tables corresponding to a plurality of load impedances; and control circuitry configured to acquire load impedance information of the load in a first scan, select a nonlinearity compensation table for compensating an amplitude and a phase of the inputted RF signal for each amplitude from the plurality of nonlinearity compensation tables based on the load impedance information, wherein the plurality of nonlinearity compensation tables include a reference nonlinearity compensation table for compensating a predetermined reference load impedance, determine the selected nonlinearity compensation table as compensation data for compensating nonlinearity of the RF signal to be outputted from the RF amplification circuit for each amplitude of the inputted RF signal based on the load impedance information, and compensate for the RF signal to be outputted from the RF amplification circuit in a second scan for each amplitude of the inputted RF signal by using the compensation data.

2. The MRI apparatus according to claim 1, wherein the load impedance information includes at least one of:

(a) a complex load impedance;

(b) a complex load admittance;

(c) a voltage standing wave ratio (VSWR) and a phase angle between a traveling wave and a reflected wave;

(d) a complex reflection coefficient; and (e) an S11 parameter.

3. The MRI apparatus according to claim 1, wherein the plurality of nonlinearity compensation tables further include at least one variation nonlinearity compensation table corresponding to a varying load impedance that is different from the reference load impedance.

4. The MRI apparatus according to claim 1, wherein the plurality of nonlinearity compensation tables further include at least one difference compensation table corresponding to a difference load impedance that is difference between the reference load impedance and a varying load impedance different from the reference load impedance.

5. The MRI apparatus according to claim 4, wherein the difference compensation table is used in another RF amplifier having a same configuration as the RF amplifier.

6. The MRI apparatus according to claim 3, wherein the reference load impedance is 50Ω.

7. The MRI apparatus according to claim 4, wherein the reference load impedance is 50Ω.

8. The MRI apparatus according to claim 1, wherein:

the memory further stores an arithmetic expression for calculating at least one nonlinearity compensation value that compensates for a plurality of nonlinearities corresponding to a plurality of load impedances; and the control circuitry is further configured to calculate the at least one nonlinearity compensation value for compensating the amplitude and the phase of the inputted RF signal for each amplitude by using the arithmetic expression based on the load impedance information, and determine the nonlinearity compensation value as the compensation data.

9. The MRI apparatus according to claim 1, wherein the control circuitry is further configured to:

generate, during the first scan, a specific nonlinearity compensation table corresponding to the load impedance of the first scan, and determine the specific nonlinearity compensation table as the compensation data.

10. The MRI apparatus according to claim 1, wherein the plurality of nonlinearity compensation tables include more nonlinearity compensation tables near load impedances of loads assumed to be frequent in the first scan and the second scan than nonlinearity compensation tables near load impedances of loads assumed to be infrequent.

11. The MRI apparatus according to claim 1, wherein the RF amplifier is further configured to compensate for nonlinearity of the RF signal to be outputted from the RF amplification circuit for each amplitude of the inputted RF signal by DPD (Digital Pre-Distortion) feedforward compensation.

12. An MRI apparatus comprising: an RF coil configured to transmit an RF signal to an object; and an RF amplifier, wherein the RF amplifier comprises:

an RF amplification circuit having a power amplification element that amplifies an inputted RF signal; and control circuitry configured to acquire imaging conditions having been set in a scan of imaging the object, the imaging conditions including at least a pulse width, a duty cycle, and an average power value, determine compensation data for compensating nonlinearity of the RF signal to be outputted from the RF amplification circuit for each amplitude of the inputted RF signal depending on the imaging conditions, and compensate for the RF signal to be outputted from the RF amplification circuit in the scan for each amplitude of the inputted RF signal by using the compensation data.

13. The MRI apparatus according to claim 12, wherein:

the RF amplifier further includes a memory storing a plurality of nonlinearity compensation tables that are for compensating temperature variation of the power amplification element and correspond to combinations of a pulse width, a duty cycle, and an average power value; and the control circuitry is configured to select a nonlinearity compensation table for compensating an amplitude and a phase of the inputted RF signal for each amplitude from the plurality of nonlinearity compensation tables depending on the imaging conditions, and determine a selected nonlinearity compensation table as the compensation data.

14. The MRI apparatus according to claim 12, wherein the RF amplifier is configured to compensate for nonlinearity of the RF signal to be outputted from the RF amplification circuit for each amplitude of the inputted RF signal by DPD feedforward compensation.

15. An RF amplifier that amplifies an inputted RF signal and outputs an amplified RF signal to a load including at least an object and an RF coil configured to transmit the amplified RF signal to the object in an MRI apparatus, the RF amplifier comprising:

an RF amplification circuit configured to amplify the inputted RF signal;

a memory that stores a plurality of nonlinearity compensation tables corresponding to a plurality of load impedances; and control circuitry configured to acquire load impedance information of the load in a first scan, select a nonlinearity compensation table for compensating an amplitude and a phase of the inputted RF signal for each amplitude from the plurality of nonlinearity compensation tables based on the load impedance information, wherein the plurality of nonlinearity compensation tables include a reference nonlinearity compensation table for compensating a predetermined reference load impedance, determine the selected nonlinearity compensation table as compensation data for compensating nonlinearity of the RF signal to be outputted from the RF amplification circuit for each amplitude of the inputted RF signal based on the load impedance information, and compensate for the RF signal to be outputted from the RF amplification circuit in a second scan for each amplitude of the inputted RF signal by using the compensation data.

* * * * *